(12) United States Patent
Fujita et al.

(10) Patent No.: US 6,316,941 B1
(45) Date of Patent: Nov. 13, 2001

(54) OPEN VIEW QUADRATURE BIRDCAGE COIL

(75) Inventors: Hiroyuki Fujita, Highland Heights; Gordon D. DeMeester, Wickliffe; William O. Braum, Twinsburg, all of OH (US)

(73) Assignee: Marconi Medical Systems, Inc., Highland Heights., OH (US)

( * ) Notice: Subject to any disclaimer, the term of this patent is extended or adjusted under 35 U.S.C. 154(b) by 0 days.

(21) Appl. No.: 09/513,062

(22) Filed: Feb. 24, 2000

(51) Int. Cl.[7] .................................................. G01V 3/00
(52) U.S. Cl. ............................................. 324/318; 324/322
(58) Field of Search .................................... 324/318, 322, 324/300, 306, 307, 309; 600/422, 423, 421

(56) References Cited

U.S. PATENT DOCUMENTS

| | | |
|---|---|---|
| 4,680,548 | 7/1987 | Edelstein et al. |
| 5,075,624 * | 12/1991 | Bezjak .................................. 324/318 |
| 5,144,240 * | 9/1992 | Mehdizaddeh et al. ............. 324/318 |
| 5,274,332 * | 12/1993 | Jaskolski et al. .................... 324/318 |
| 6,100,691 * | 8/2000 | Yeung ................................. 324/318 |

OTHER PUBLICATIONS

"An Efficient, Highly Homogeneous Radiofrequency Coil for Whole–Body NMR Imaging at 1.5 T" by Cecil E. Hayes, et al. Journal of Magnetic Resonance 63, 622–628 (1985). Copyright 1985 by Academic Press, Inc.

"Electromagnetic Analysis and Design in Magnetic Resonance Imaging" by Jianming Jin. Dept. Of Electrical and Computer Engineering, Univ. Of Ill. At Urbana—Champaign, Urbana, IL. Copyright 1999 by CRC Press LLC.

"The Theory of the Bird–Cage Resonator" by James Tropp. Journal of Magnetic Resonance 82, 51–62 (1989). Copyright 1989 by Academic Press, Inc.

U.S. application No. 09/398,650, Fujita et al., filed Sep. 1999.

* cited by examiner

*Primary Examiner*—Louis Arana
(74) *Attorney, Agent, or Firm*—Fay, Sharpe, Fagan, Minnich & McKee, LLP

(57) ABSTRACT

A tunable radio frequency birdcage coil (30) is oriented vertically in a bore-type magnetic resonance apparatus. The birdcage coil (30) includes a pair of end rings (60, 62) disposed in parallel planes along a coil axis which is orthogonal to the main magnetic field. A plurality of rungs (64) electrically interconnect the end rings (60, 62) to form a generally cylindrical volume. The end rings (60, 62) and rungs (64) are mounted on a hinged (68) dielectric former (66). Conductive connectors (70) releasably fasten the end rings (60, 62) so that the coil (30) may be opened and closed to receive a portion of a subject to be examined. A conductive loop (80) is inductively coupled and positioned parallel to the end rings (60, 62). The conductive loop (80) is slidably adjustable along the coil axis for matching and tuning end-ring modes of the coil. The coil is oriented to provide a subject disposed therein with an open view for fMRI applications. Means for stimulating the visual senses (100) is mounted adjacent the examination region (14) to facilitate fMRI applications.

23 Claims, 4 Drawing Sheets

OPEN VIEW QUADRATURE BIRDCAGE COIL

BACKGROUND OF THE INVENTION

The present invention relates to the magnetic resonance arts. It finds particular application in conjunction with medical diagnostic imaging and will be described with particular reference thereto. It is to be appreciated, however, that the invention may find further application in quality control inspections, spectroscopy, and the like.

Conventionally, magnetic resonance systems generate a strong, temporally constant main magnetic field, commonly denoted Bo, in a free space or bore of a magnet. This main magnetic field polarizes the nuclear spin system of an object. Nuclear spins of the object then possess a macroscopic magnetic moment vector preferentially aligned with the direction of the main magnetic field. In a superconducting annular magnet, the $B_0$ magnetic field is generated along the longitudinal axis of the cylindrical bore, which is assigned to be the z-axis. In an open system, the $B_0$ magnetic field is oriented vertically between a pair of pole pieces, which is assigned to be the z-axis.

To generate a magnetic resonance signal, the polarized spin system is excited at resonance by applying a radio frequency (RF) magnetic field $B_1$, with a vector component perpendicular to that of the $B_0$ field. In a transmission mode, the radio frequency coil is pulsed to tip the magnetization of the polarized sample away from the z-axis. As the magnetization precesses around the z-axis, the precessing magnetic moment generates a magnetic resonance signal at the Lamor frequency which is received by the same or another radio frequency coil in a reception mode.

Birdcage coils are often used to excite and/or receive magnetic resonance signals, especially in horizontal field or bore-type MRI systems, because of the good $B_1$, uniformity over a large field of view. In bore-type systems, the axis of the birdcage coil is typically aligned with the z-axis and the resident resonant current that generates the circularly polarized $B_1$ field is sampled as an orthogonal pair of transverse modes.

However, aligning the coil axis with the $B_0$, field in a bore-type machine can be problematic. Often, patients experience feelings of claustrophobia during head imaging applications due to the proximity of the birdcage coil to the patient's face. In addition, aligning the coil axis with the horizontal $B_0$ field hampers fMRI applications, which require additional space near the patient's face for devices to stimulate the visual senses.

The present invention contemplates a new and improved radio frequency birdcage coil which overcomes the above-referenced problems and others.

SUMMARY OF THE INVENTION

In accordance with one aspect of the present invention, a magnetic resonance apparatus includes a main magnet which generates a temporally constant and substantially uniform main magnetic field along a main magnetic field axis through an examination region. A radio frequency (RF) transmitter and an RF volume coil assembly perform at least one of exciting magnetic resonance dipoles within the examination region and receiving magnetic resonance signals from the resonating dipoles. A receiver receives and demodulates the magnetic resonance signals. The RF volume coil assembly includes a pair of end rings interrupted by a plurality of reactive elements. The end rings are disposed in displaced parallel planes along a coil axis which is orthogonal to the main magnetic field axis. A plurality of spaced rungs electrically interconnect the end rings to define a generally cylindrical volume. The end rings and rungs are supported by a dielectric former which has separable portions. The RF volume coil further comprises a conductive loop which is inductively coupled to the end rings.

In accordance with another aspect of the present invention, a method for magnetic resonance imaging of a portion of a patient disposed along a subject axis includes opening an RF volume coil having a coil axis along a hinged portion parallel to the coil axis. The method further includes introducing a portion of the subject to be examined into the RF volume coil and closing the hinged RF volume coil to enclose the portion of the subject to be examined within the coil. An examined portion of the subject is positioned in an examination region with the coil axis orthogonal to the subject axis and a main magnetic field is generated parallel to and along the subject axis through the examination region. RF signals are transmitted into the examined subject portion to induce magnetic resonance in nuclei and magnetic resonance signals are received using the RF volume coil. At least a first resonant mode signal and a second resonant mode signal are extracted from the RF volume coil and reconstructed into an image representation.

In accordance with another aspect of the present invention, a pull-apart radio frequency birdcage coil includes a pair of conductive end rings snapped together at a detachment point by conductive fasteners. The end rings are disposed in parallel planes along a coil axis. A plurality of spaced rungs electrically interconnect the end rings, both of which are mounted onto a former having an opening to receive a portion of a subject to be examined. A loop conductor is releasably attached to the former and slidably disposed along a coil axis to adjust the inductive coupling with the end rings. A first sampling port electrically connected to the loop conductor samples a first resonant mode directed along the coil axis. A second sampling port electrically connected to one end ring samples a second resonant mode orthogonal to the coil axis, such that the RF birdcage coil operates as a quadrature coil.

One advantage of the present invention is that it reduces patient claustrophobia.

Another advantage of the present invention is that it provides quadrature capability using an end-ring mode and sinusoidal mode.

Another advantage of the present invention resides in its applicability to fMRI applications.

Yet another advantage of the present invention resides in a full volume RF coil offering good $B_1$ uniformity regardless of $B_0$ field orientation.

Other benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
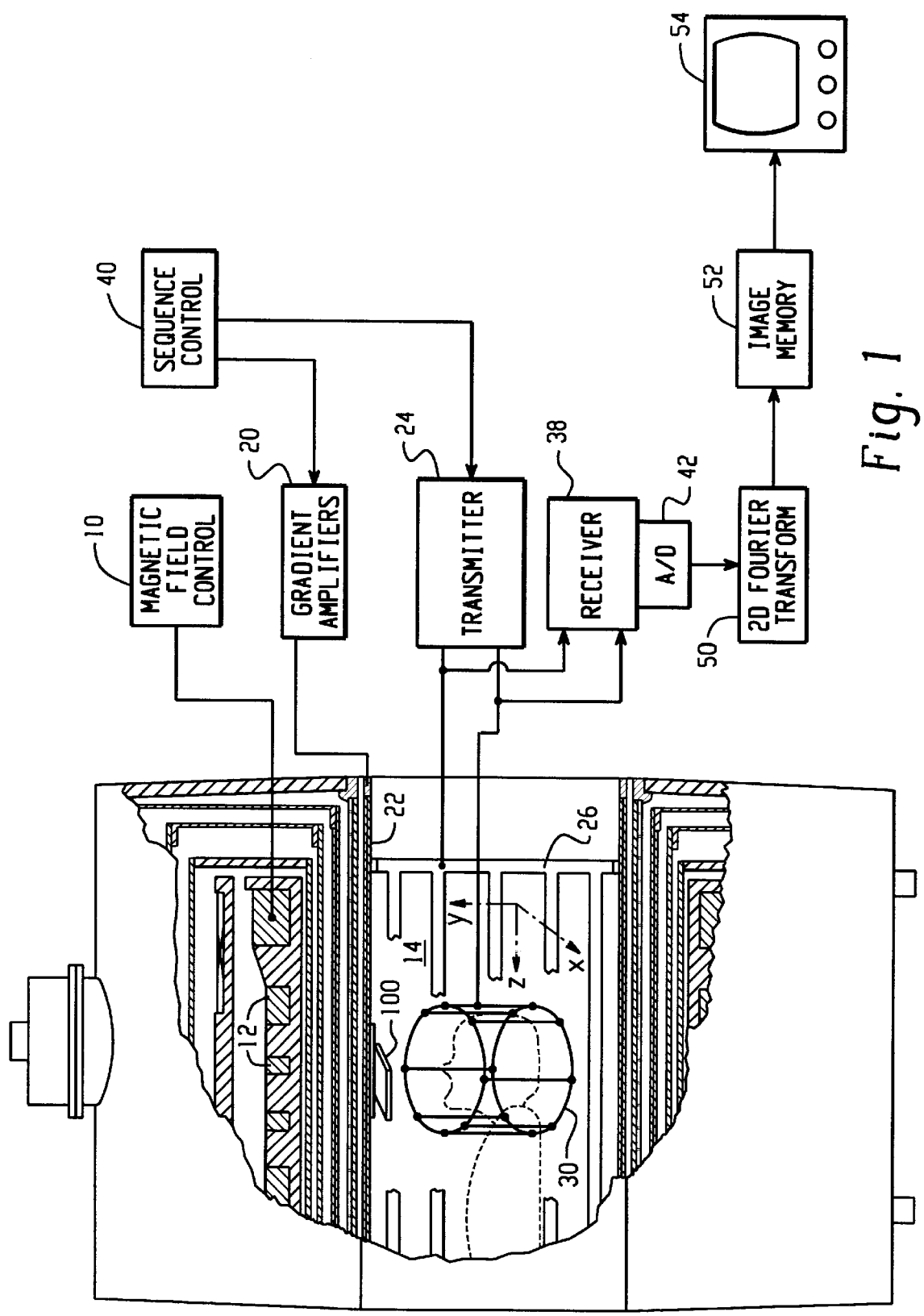
FIG. 1 is a diagrammatic illustration of a magnetic resonance system in accordance with the present invention.

With reference to FIG. 1, a main magnetic field control 10 controls superconducting or resistive magnets 12 such that a substantially uniform, temporally constant main magnetic field $B_0$ is created along a z-axis through an examination region 14. Although a bore-type magnet is illustrated in FIG. 1, it is to be appreciated that the present invention is applicable to open or vertical field magnetic systems as well. A magnetic resonance sequence applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A radio frequency transmitter 24, preferably digital, transmits radio frequency pulses or pulse packets to a whole-body RF birdcage coil 26 to generate $B_1$ magnetic fields within the examination region. A typical radio frequency pulse is composed of a packet of immediately contiguous pulse segments of short duration which, taken together with each other and any applied gradients, achieve the selected magnetic resonance manipulation. The RF pulses are used to saturate, excite resonance, invert magnetization, refocus resonance, or manipulate resonance in selected portions of the examination region. For whole-body applications, the resonance signals are commonly picked up in quadrature by the whole-body RF birdcage coil 26.

Local coils are commonly placed contiguous to selected regions of the subject for generating radio frequency pulses into and/or receiving induced magnetic resonance signals from the selected regions. A birdcage coil 30 is one type of local coil used in magnetic resonance applications. Preferably, the local radio frequency birdcage coil 30 receives magnetic resonance signals emanating from the selected region. The resultant radio frequency signals are picked up in quadrature by the local RF coil 30 or other specialized RF coils and demodulated by a receiver 38, preferably a digital receiver.

A sequence control processor 40 controls the gradient pulse amplifiers 20 and the transmitter 24 to generate any of a plurality of magnetic resonance imaging and spectroscopy sequences, such as echo-planar imaging, echo-volume imaging, gradient and spin echo imaging, fast spin echo imaging, and the like. For the selected sequence, the receiver 38 receives a plurality of data lines in rapid succession following each RF excitation pulse. An analog-to-digital converter 42 converts each data line to a digital format. The analog-to-digital converter 42 is disposed between the radio frequency receiving coil and the receiver for digital receivers and is disposed downstream (as illustrated) from the receiver for analog receivers. Ultimately, the demodulated radio frequency signals received are reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52 where it may be accessed by a display 54, such as a video monitor, active matrix monitor, or liquid crystal display, which provides a human-readable display of the resultant image.

Figure 2:
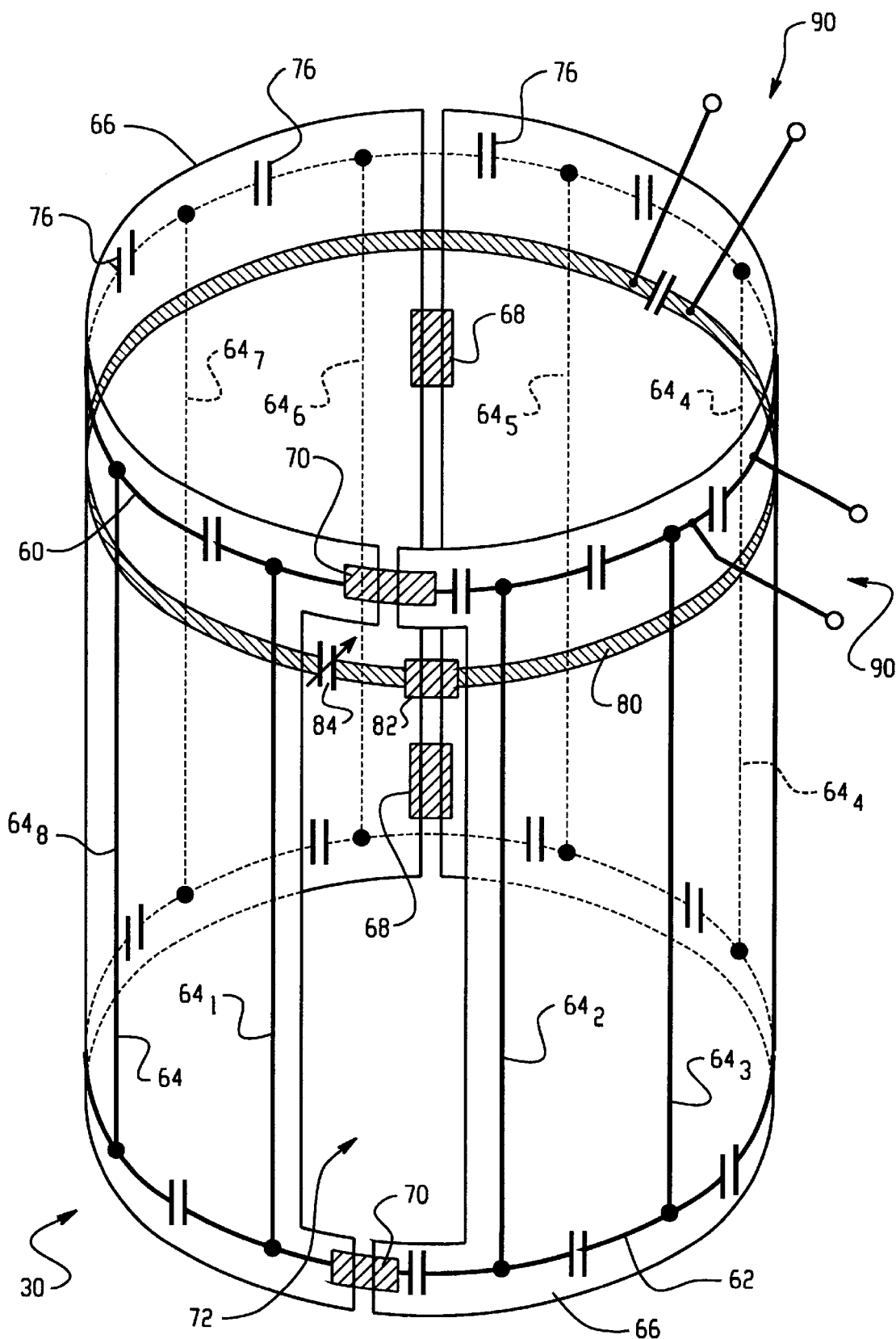
FIG. 2 is a diagrammatic illustration of an exemplary RF birdcage coil with uniformly spaced rungs in accordance with the present invention.

With reference to FIG. 2 and continued reference to FIG. 1, the RF birdcage coil 30 includes a pair of end rings 60, 62 which are disposed in a parallel and spaced-apart relation. The end rings 60, 62 are electrically interconnected by spaced legs or rungs $64_1$, . . . , $64_8$ to form a generally cylindrical volume. For structural stability and manufacturing simplicity, the birdcage coil 30 is constructed on a dielectric support or former 66 which is cylindrical in shape. As will be described more fully below, sections of the former may be removed to provide openness. In the preferred embodiment, the dielectric former 66 is constructed of resin-bonded fiberglass, ABS, or another plastic with low dielectric loss which does not contain free protons or other dipoles and in which magnetic resonance will be induced. In one embodiment, the end rings 60, 62 and rungs $64_1$, . . . , $64_8$ are copper foil strips. These copper strips are fastened to the former 66 in a configuration corresponding to the preferred birdcage coils.

Figure 3:
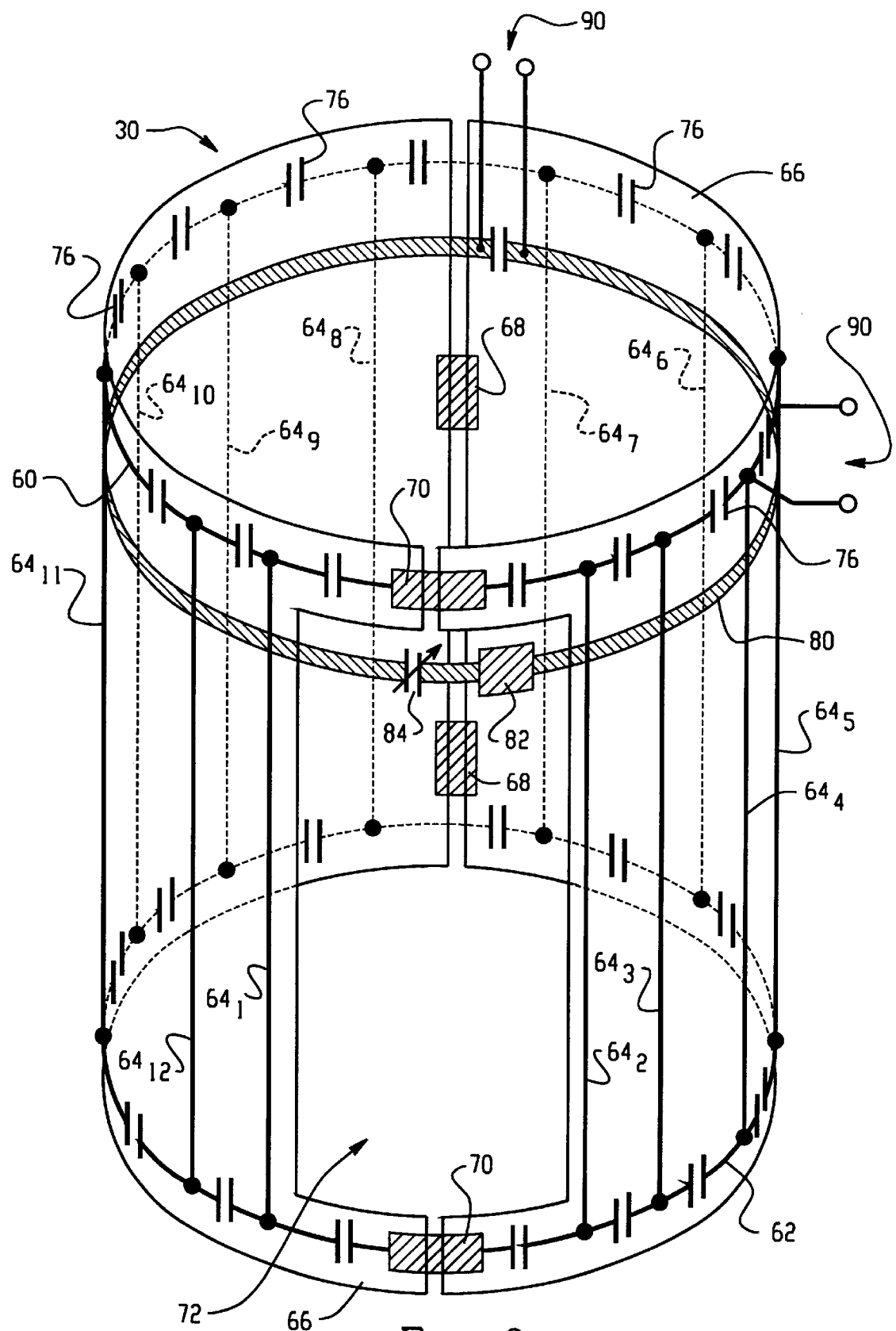
FIG. 3 is a diagrammatic illustration of an exemplary RF birdcage coil with non-uniformly spaced rungs in accordance with the present invention.

With reference to FIG. 2 and FIG. 3, in one preferred embodiment, the RF birdcage coil 30 contains eight evenly-spaced rungs $64_1$, . . . , $64_8$, as illustrated in FIG. 2. In this embodiment, each adjacent pair of rungs subtend an angle of 45 degrees on each end ring 60, 62. In a second preferred embodiment, the RF birdcage coil 30 contains twelve non-uniformly spaced rungs $64_1$, . . . , $64_{12}$, as illustrated in FIG. 3. In both the eight-rung embodiment and twelve-rung embodiment, it is to be appreciated that a larger or smaller number of rungs may be employed. Those skilled in the art will appreciate that increasing the number of rungs on the coil increases the $B_1$, uniformity of the transverse or sine modes of the birdcage coil.

In one embodiment, the dielectric former 66 is hinged with a plurality of hinges 68 such that the coil may be opened to receive a portion of a subject to be examined. Conductive connectors 70 releasably fasten the coil for opening the coil and closing it around a portion of a subject disposed therein. Preferably, the connectors 70 are in electrical communication with the end rings 60, 62, as illustrated in FIGS. 2 and 3. The connectors 70 are conductive clips, snaps, or other friction fit fasteners which do not alter significantly the impedance of each end ring. In another embodiment, the dielectric former 66 pulls apart completely into two substantially equal halves. In this embodiment, no hinges are employed. Rather, conductive connectors, as described above, are located on opposite sides of the coil in electrical communication with the end rings.

Figure 4:
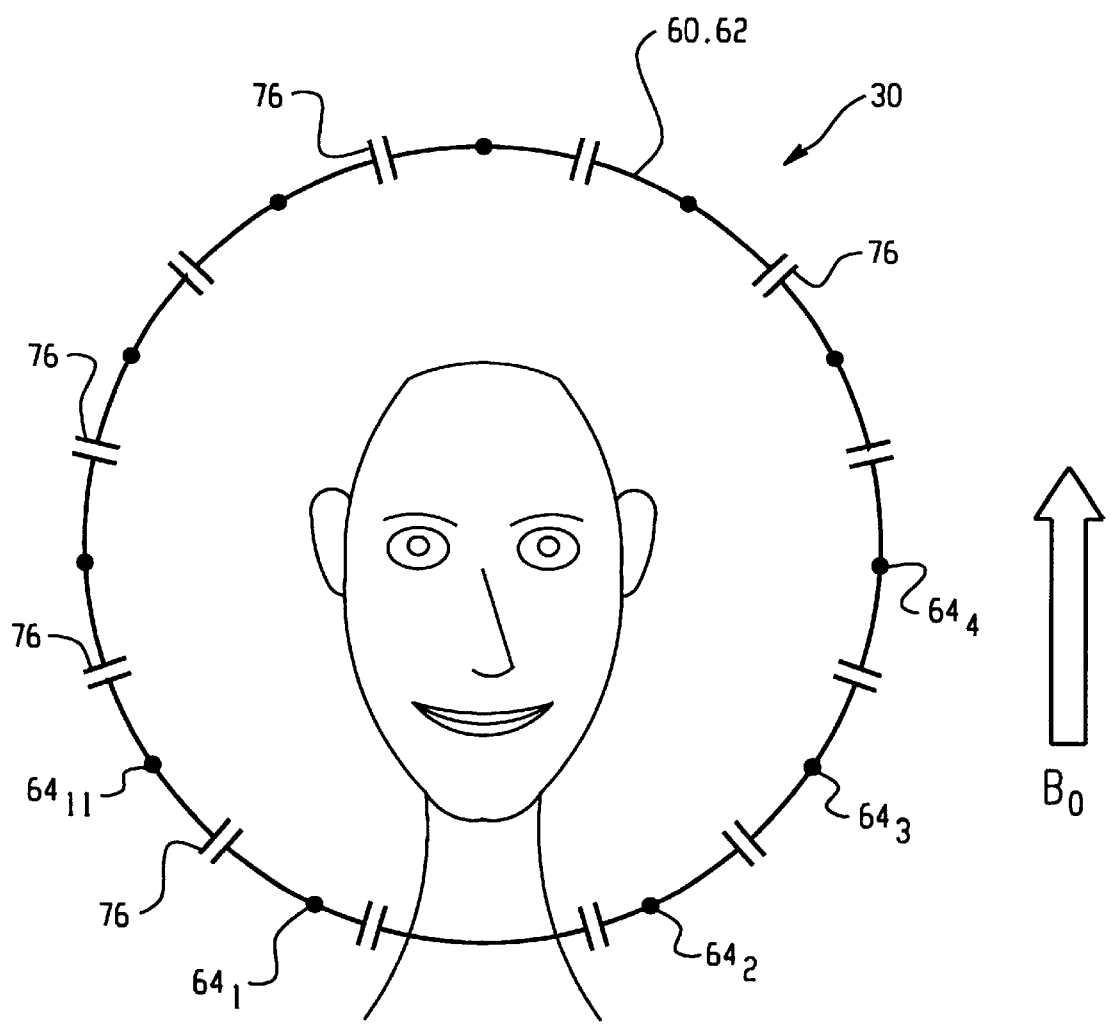
FIG. 4 is a top perspective view of an open view RF birdcage coil in accordance with the present invention.

As illustrated in FIG. 2, the rungs $64_1$, . . . , $64_8$, of the evenly-spaced eight-rung embodiment are spaced wide enough to accommodate a portion of the subject to be examined between two adjacent rungs. In addition, the dielectric former 66 includes a subject entry gap or opening 72 between two adjacent rungs $64_1$, $64_2$ for receiving the portion of the subject to be examined. For example, in head imaging applications, a subject's neck may be disposed between two adjacent rungs $64_1$, $64_2$. Such a head imaging application is illustrated in FIG. 4.

As illustrated in FIG. 3, the rungs $64_1$, . . . , $64_{12}$, of the twelve-rung embodiment are spaced non-uniformly such that a circumferential space between an adjacent pair of rungs $64_1$, $64_2$ is wide enough to accommodate a portion of the subject to be examined. The circumferential space between the two adjacent rungs $64_1$, $64_2$ is wider than the space between any other two adjacent rungs on the coil. In this embodiment, the dielectric former 66 also includes a subject entry gap 72 between the two adjacent rungs $64_1$, $64_2$ for receiving the portion of the subject to be examined. Again, FIG. 4 illustrates a head imaging application utilizing the aforementioned features of the present invention.

As is known generally in the art, the rungs 64 are sensitive to $B_1$, fields orthogonal to the axis of the coil, which is illustrated in FIG. 1 as oriented along the y-axis. In other words, the rungs are inherently sensitive to the transverse, circularly polarized $B_1$ field which is orthogonal to the $B_1$ field of the end-ring mode, which is parallel to the coil axis. Accordingly, when the end-ring mode and a conventional sinusoidal/cosinusoidal resonant mode are tuned to the same frequency, three-axis performance is achieved. More commonly, only the end ring mode and a sinusoidal mode orthogonal to the $B_0$ field are utilized.

Reactive elements, preferably capacitors 76, interrupt the end rings 60, 62 of the coil. The capacitors are provided to tune the conventional sinusoidal/cosinusoidal resonant modes, as is known generally in the art. While capacitive elements 76 are illustrated in the end rings 60, 62, those skilled in the art will recognize that capacitive elements may be alternatively or conjunctively located in the rungs 64 to achieve lowpass, bandpass, or highpass operation.

Tuning of the end-ring mode is not as straightforward. In order to tune the end-ring mode to typical frequencies, an electrically conducive loop 80 is inductively coupled to the end rings 60, 62. Like the end rings 60, 62, the conductive loop 80 is releasably fastened with a conductive connector 82. As described above, the conductive connector 82 may be a conductive clip, snap, or other friction fit fastener which does not alter significantly the impedance of the conductive loop 80. The conductive loop 80 is tuned or matched to the desired frequency by sliding the loop longitudinally along the axis of the coil until the optimal condition for the end-ring mode operation is met. At least one variable capacitance 84 interrupts the loop 80 to aid in tuning to the desired frequency with appropriate matching. In one embodiment, the conductive loop 80 is a copper foil strip.

As illustrated in FIGS. 2 and 3, resonant signals associated with each detectable $B_1$, field are communicated to the receiver 38 through sampling ports 90. One skilled in the art will appreciate that three-axis performance is achievable by such a birdcage coil. The availability of three resonant modes, tuned to a common frequency, enables operators to place the coil in any desired orientation, irrespective of $B_0$ field direction, and receive usable signals. Moreover, it is to be appreciated that the coil may operate with two orthogonal modes tuned to the same frequency, while the end ring mode may be sampled for spectroscopy applications at a different frequency.

Referring back to FIG. 4 and FIG. 1, the birdcage coil is preferably oriented with its coil axis orthogonal to a horizontally-directed $B_0$ magnetic field. With the birdcage coil in this orientation and a subject disposed in the bore of the magnet for a head imaging application, open space exists outside of the coil in front of the patient's face. For such an application, the patient can see through the end of the coil as illustrated in FIG. 4. This open-view feature of the birdcage coil accommodates devices for stimulating the visual senses. Such means for stimulating the visual senses 100 is mounted above the birdcage coil in the subject's line of sight as shown in FIG. 1. Stimulation of the visual senses by an external source allows for fMRI studies of a subject. Those skilled in the art will appreciate that in such fMRI studies, the patient's visual, audio, and/or olfactory senses may be stimulated while head scan data is collected. In another embodiment, the coil may be adapted to accomodate audio devices for additional fMRI applications.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance apparatus having a main magnet which generates a main magnetic field along a main magnetic field axis through an examination region, a radio frequency (RF) transmitter and an RF coil assembly which performs at least one of exciting magnetic resonance dipoles within the examination region and receiving magnetic resonance signals from the resonating dipoles, and a receiver which receives and demodulates the magnetic resonance signals, the RF coil assembly comprising:

a pair of end rings interrupted by a plurality of reactive elements, said end rings disposed in displaced parallel planes along a coil axis, said coil axis being orthogonal to the main magnetic field axis;

a plurality of spaced rungs electrically interconnecting said end rings to define a generally cylindrical volume, the rungs supporting a first resonance mode and the end rings supporting an end ring resonant mode, the first resonance mode and the end ring resonance mode being a common RF frequency and the end ring mode being sensitive to RF components that are parallel to the coil axis and perpendicular to the main magnetic field axis and the first resonance mode being sensitive to RF components that are perpendicular to the coil axis and the main magnetic field axis;

said end rings and said rungs being supported by a dielectric former;

a conductive loop inductively coupled to both end rings;

a first sampling port for sampling the first resonance mode; and a second sampling port for sampling the end ring resonance mode.

2. The magnetic resonance apparatus according to claim 1, wherein the dielectric former is hinged with a plurality of hinges such that the RF volume coil is adapted to be opened to receive a portion of a subject to be examined.

3. The magnetic resonance apparatus according to claim 1, wherein the RF coil separable portions are fastened together by a plurality of conductive connectors, said connectors being in electrical communication with the end rings.

4. The magnetic resonance apparatus according to claim 1, wherein the conductive loop is configured in sections supported by the dielectric former, a conductive connector connects the conductive loop sections.

5. The magnetic resonance apparatus according to claim 4, wherein the conductive loop is interrupted by at least one variable capacitive element.

6. The magnetic resonance apparatus according to claim 1, wherein an adjacent pair of said rungs are spaced to accommodate therebetween a portion of a subject to be examined.

7. The magnetic resonance apparatus according to claim 6, wherein the dielectric former defines a subject entry gap between two adjacent rungs mounted to the former to facilitate receipt of the portion of the subject to be examined.

8. The magnetic resonance apparatus according to claim 1, wherein the RF coil assembly is oriented such that a subject whose head is disposed within the RF coil assembly views the means for stimulating the visual senses through one end ring of the RF coil assembly.

9. A magnetic resonance apparatus having a main magnet which generates a main magnetic field along a main magnetic field axis through an examination region, a radio frequency (RF) transmitter and an RF coil assembly which performs at least one of exciting magnetic resonance dipoles within the examination region and receiving magnetic resonance signals from the resonating dipoles, and a receiver which receives and demodulates the magnetic resonance signals, the RF coil assembly comprising:
   a pair of end rings disposed in displaced parallel planes along a coil axis, said coil axis being orthogonal to the main magnetic field axis;
   a plurality of spaced rungs electrically interconnecting said end rings to define a generally cylindrical volume;
   a dielectric former which supports said end rings and said rungs; and
   a conductive loop inductively coupled to both end rings, said conductive loop being slidably disposed along the coil axis for tuning an end ring mode.

10. A magnetic resonance apparatus having a main magnet which generates a main magnetic field along a main magnetic field axis through an examination region, a radio frequency (RF) transmitter and an RF coil assembly which performs at least one of exciting magnetic resonance dipoles within the examination region and receiving magnetic resonance signals from the resonating dipoles, and a receiver which receives and demodulates the magnetic resonance signals, the RF coil assembly comprising:
   a pair of end rings which support an end ring mode, said end rings disposed in displaced parallel planes along a coil axis, said coil axis being orthogonal to the main magnetic field axis;
   a plurality of non-uniformly spaced rungs electrically interconnecting said end rings to define a generally cylindrical volume, said rungs being spaced such that an adjacent pair of said rungs are spaced to accommodate therebetween a portion of a subject to be examined, the rungs supporting a resonance mode in quadrature to the end ring mode; and
   a conductive loop inductively coupled to both end rings.

11. The magnetic resonance apparatus according to claim 10, wherein the dielectric former includes a subject entry gap between the wide-spaced pair of rungs through which a portion of the subject is received.

12. A magnetic resonance apparatus having a main magnet which generates a main magnetic field along a main magnetic field axis through an examination region, a radio frequency (RF) transmitter and an RF coil assembly which performs at least one of exciting magnetic resonance dipoles within the examination region and receiving magnetic resonance signals from the resonating dipoles, and a receiver which receives and demodulates the magnetic resonance signals, the RF coil assembly comprising:
   a pair of end rings which are tuned to support an end ring mode, said end rings disposed in displaced parallel planes along a coil axis, said coil axis being orthogonal to the main magnetic field axis;
   a plurality of spaced rungs electrically interconnecting said end rings, the rungs being tuned to support a rung resonance mode;
   a conductive loop inductively coupled to the end rings; and
   means for stimulating at least one of the visual, audio, and olfactory senses of a subject disposed adjacent the examination region.

13. A method for magnetic resonance imaging of a portion of a subject disposed along a subject axis, said method including:
   (a) opening a RF volume coil having a coil axis along a hinged portion parallel to the coil axis, said RF volume coil having a pair of end rings spaced apart in parallel planes, and a plurality of leg conductors interconnecting the end rings;
   (b) introducing a portion of the subject to be examined into the RF volume coil;
   (c) closing the hinged RF volume coil to enclose the portion of the subject to be examined within the coil;
   (d) positioning an examined portion of the subject in an examination region with the coil axis orthogonal to the subject axis;
   (e) generating a main magnetic field parallel to and along the subject axis through the examination region;
   (f) transmitting RF signals into the examined subject portion to induce magnetic resonance in nuclei;
   (g) receiving the magnetic resonance signals using the RF volume coil;
   (h) extracting at least a first resonant mode signal and a second end ring resonant mode signal from the RF volume coil, said first resonant mode and second end ring resonant mode being in a quadrature relationship; and
   (i) reconstructing the magnetic resonance signals into an image representation.

14. A method for magnetic resonance imaging of a portion of a subject disposed along a subject axis, said method including:
   (a) opening a RF volume coil having a coil axis;
   (b) introducing a portion of the subject to be examined into the RF volume coil;
   (c) enclosing the portion of the subject to be examined within the coil;
   (d) positioning an examined portion of the subject in an examination region;
   (e) generating a main magnetic field orthogonal to the coil axis through the examination region;
   (f) transmitting RF signals into the examined subject portion to induce magnetic resonance in nuclei;
   (g) receiving quadrature components of the magnetic resonance signals using the RF volume coil;
   (h) extracting a first resonant mode signal and inductively coupling a conductive loop to end rings of the coil to pick-up a second end-ring resonant mode signal; and
   (i) reconstructing the magnetic resonance signals into an image representation.

15. The method according to claim 14, further including:
   matching the end ring resonant mode signal and the first resonant mode signal to a common frequency.

16. The method according to claim 15, wherein the matching step includes:
   adjusting at least one of a position and a capacitance of the conductive loop to the end rings.

17. A method for magnetic resonance imaging of a portion of a subject disposed along a subject axis, said method including:

enclosing a portion of the subject to be examined into an RF volume coil which had end rings disposed in parallel planes perpendicular to a coil axis;

positioning an examined portion of the subject and the RF coil in an examination region;

generating a main magnetic field through the examination region across the coil axis;

transmitting RF signals into the examined subject portion to induce magnetic resonance in the subject;

receiving the magnetic resonance signals with the RF volume coil;

extracting a first resonant mode signal and inductively coupling a conductive loop to end rings of the coil to pick-up a second, end ring resonant mode signal; and adjusting an effective reactance of the RF volume coil to tune the end ring resonant mode signal and the first resonant mode signal at a common frequency.

18. A pull-apart radio frequency (RF) birdcage coil for a magnetic resonance apparatus, the RF birdcage coil comprising:

a pair of conductive end rings each snapped together at a detachment point by conductive fasteners, said end rings disposed in parallel planes transverse to a coil axis;

a plurality of spaced rungs electrically interconnecting said end rings;

a hinged former having said end rings and said rungs mounted thereto, said hinged former opening to receive a portion of a subject to be examined;

an inductive tuning loop which is releasably attached to the former and slidably disposed along a coil axis between and inductively coupled to both end rings;

a first sampling port electrically connected to the inductive tuning loop, said first sampling port sampling a first resonant mode directed along the coil axis; and a second sampling port electrically connected to one of the end rings, said second sampling port sampling a second resonant mode orthogonal to the coil axis, such that the RF birdcage coil operates as a quadrature coil.

19. The RF birdcage coil according to claim 18, wherein the rungs are uniformly spaced around the end rings, said rungs being spaced to accommodate therebetween a portion of a subject to be examined.

20. The RF birdcage coil according to claim 19, wherein the dielectric former includes a subject entry gap between adjacent rungs mounted thereto, said subject entry gap adapted for receiving the portion of the subject to be examined.

21. The RF birdcage coil according to claim 18, wherein at least two of the plurality of rungs are non-uniformly spaced such that a circumferential space between one pair of adjacent rungs has a width sufficient to accommodate therebetween a portion of a subject to be examined.

22. The RF birdcage coil according to claim 21, wherein the dielectric former includes a subject entry gap between the pair of adjacent rungs for receiving the portion of the subject to be examined.

23. A magnetic resonance system comprising:

(a) at least one solenoid coil for generating a temporally constant magnetic field along a horizontal axis of the solenoid coil;

(b) an RF coil including:

(1) a pair of parallel end rings disposed orthogonal to a coil axis, (2) a plurality of rungs disposed parallel to the coil axis, (3) a conductive loop disposed parallel to the end rings, the RF coil being disposed in the temporally constant magnetic field with the coil axis disposed across the horizontal solenoid coil axis;

(c) a receiver connected with the RF coil to receive in quadrature resonance signals picked up by the end rings and by the rungs.

* * * * *